United States Patent [19]

Carpenter

[11] 4,199,728

[45] Apr. 22, 1980

[54] SLOPE DETECTOR

[75] Inventor: Raymond J. Carpenter, Newtown, Pa.

[73] Assignee: Innovative Medical Systems, Corp., Warminster, Pa.

[21] Appl. No.: 935,550

[22] Filed: Aug. 21, 1978

[51] Int. Cl.² ............................................ H03K 5/153
[52] U.S. Cl. ..................................... 328/114; 307/231
[58] Field of Search ................ 328/114, 132; 307/231, 307/232

[56] References Cited

U.S. PATENT DOCUMENTS

| | | | |
|---|---|---|---|
| 3,711,779 | 1/1973 | Allington | 328/114 |
| 4,041,404 | 8/1977 | Lewis, Jr. | 328/114 X |
| 4,114,083 | 9/1978 | Benham et al. | 328/132 X |

Primary Examiner—John Zazworsky
Attorney, Agent, or Firm—Robert J. Mooney

[57] ABSTRACT

An electronic circuit which tracks an electrical signal to determine if the slope of the signal equals or exceeds a predetermined value in a predetermined time.

3 Claims, 11 Drawing Figures

SLOPE DETECTOR

BACKGROUND OF THE INVENTION

This invention relates to electronic slope detectors and in particular to a device which determines if a time varying electrical signal has a slope which equals or exceeds a predetermined value in a predetermined time.

The slope detector has wide application in a variety of fields where it is desirable to determine if the slope of an electrical signal is equal to or greater than a predetermined magnitude for a predetermined time. The signal itself is the product of the measurement or sensing of a physical phenomenon and the slope of the signal contains useful information which can be extracted for further processing.

The slope detector has particular application in the medical arts where it is sometimes necessary to determine the clotting time of plasma. Others have discovered that as a sample of plasma clots its ability to transmit light decreases. By sensing the rate of change of light transmission and by ascertaining the time at which this rate of change equals or exceeds a predetermined value for a predetermined time, the clotting time of the plasma can be reliably determined.

There is a variety of known slope detectors, however many of them employ a differentiating capacitor, the use of which introduces unwanted errors.

Accordingly, it is an object of this invention to provide a device which determines if the slope of a time varying electrical signal equals or exceeds a predetermined value in a predetermined time. It is a further object of this invention to provide a device which derives relevant information about the slope of a time varying electrical signal without the use of a differentiating capacitor. These and other objects are achieved as follows.

SUMMARY OF THE INVENTION

An input signal is applied to a conventional buffer amplifier. The buffered input signal is applied to a conventional tracking analog to digital converter which tracks the input signal and produces an output signal that is nearly equal to the input signal. A first differential amplifier of conventional construction produces a coarsely zeroed signal that is equal to the difference between the input signal and the output of the converter. At this point coarse zeroing of the input signal has been accomplished and the converter is switched into a hold mode. This output signal is simultaneously applied to a sample and hold circuit and a second differential amplifier both of which are of conventional construction. The sample and hold circuit samples the signal and produces a matching signal. The second differential amplifier thereafter produces a finely zeroed signal at the zero level. At this point cancellation of the input signal has been accomplished and the sample and hold circuit is switched into a hold mode and a window time of predetermined duration is begun.

The output of the second differential amplifier is applied to one input of a comparator. After the input signal has been cancelled, any change in the input signal will cause the output of the second differential amplifier to deviate from zero. If the output of the second differential amplifier equals or exceeds a reference voltage applied to the other input of the comparator within a predetermined window time, the output of the comparator changes from one level to another and is clocked into a count logic circuit.

After the window time, the input signal is cancelled again and the foregoing process repeated. If the comparator changes levels during three successive window times, the count logic circuit produces an output signal which indicates that the slope of the input signal has equaled or exceeded a predetermined value in a predetermined time. If the comparator changes levels during one or more but less than three successive window times, the count logic circuit is arranged to automatically reset to a zero count state.

All timing signals are provided by a timing generator of conventional construction. The slope detector is initialized by means of an enable gating circuit of conventional construction.

The detection level of the slope detector is principally determined by the overall gain, G, of the system up to the input of the comparator, the value of the reference voltage, VR, and the duration of the window time, TW. Within the constraints of the conventional circuit elements, these three factors may be manipulated to produce a desired detection level. For example, to determine if an input signal has a slope, S, which equals or exceeds minus one millivolt per second, the gain, G, is made equal to 250, the reference voltage, VR, is set at −100 mv and the window time is set at 400 ms.

Other objects, advantages and novel features of the invention will become apparent from the following detailed description of the invention when considered in conjunction with the accompanying drawings.

Although this invention is described with respect to a preferred embodiment, many variations and modifications may be obvious to those skilled in the art. Therefore, the scope of the invention is not limited by the specific disclosure herein but by the appended claims.

DESCRIPTION OF THE PREFERRED EMBODIMENT

Figure 1:
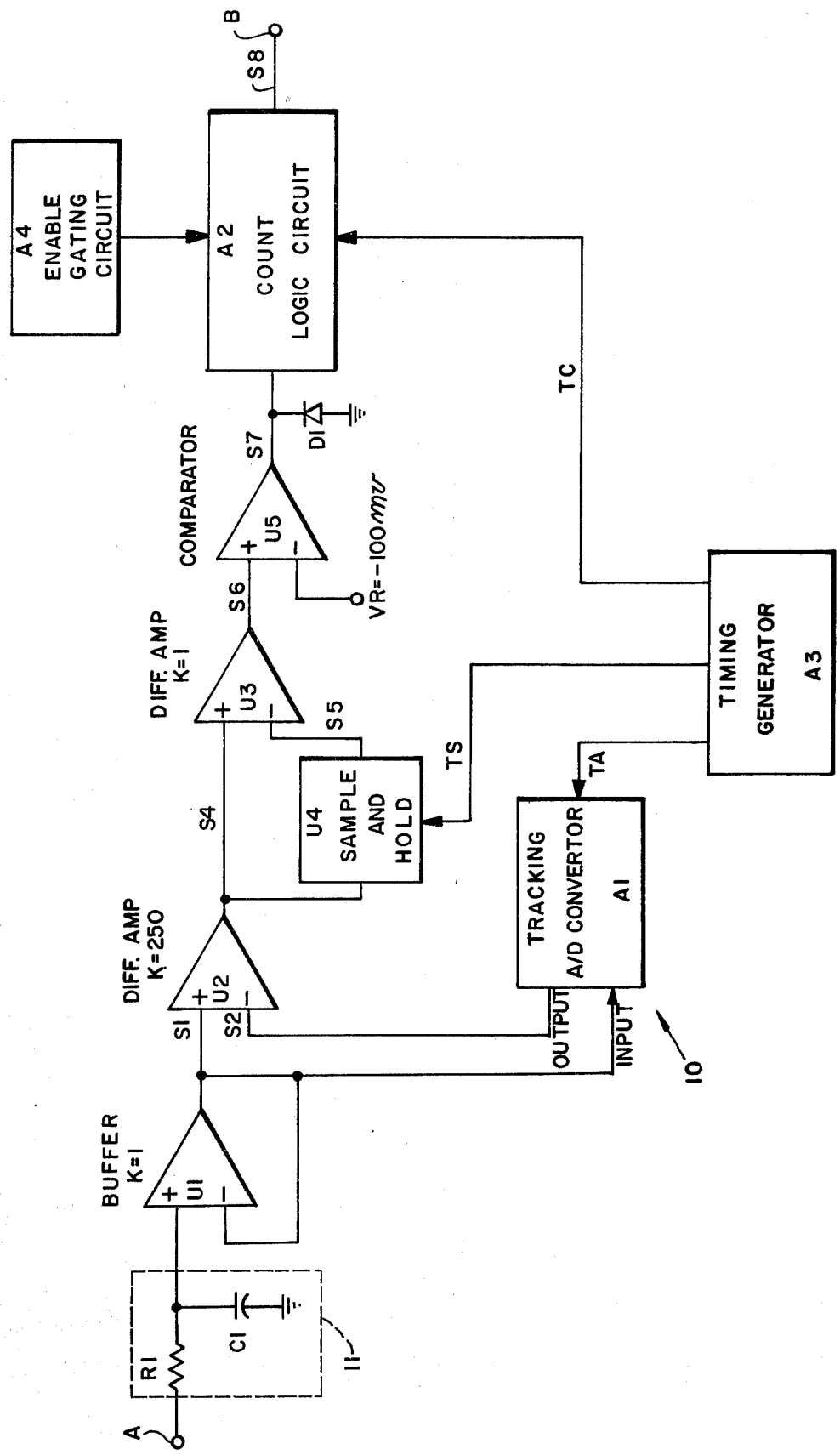
FIG. 1 is a block diagram of a slope detector constructed according to the invention.

Referring to FIG. 1, the slope detector 10 operates as follows. A step function enable signal is applied to the count logic circuit A2 to initialize the system 10 by resetting the count logic circuit A2 to zero to thereby produce a low output signal S8. The input signal S1, the slope of which is to be detected, is applied to an input terminal A and is thereafter applied to a lowpass filter 11 composed of R1 and C1. The lowpass filter 11 removes any spikes or high frequency noise from the input signal S1. The filtered input signal S1 is next applied to the input of a buffer U1, an operational amplifier operating as a unity gain voltage follower. The buffer U1 has a very high input impedance to minimize loading of the lowpass filter 11 and the input signal S1. The output signal S1 of the buffer U1 is simultaneously applied to the positive input of a differential amplifier U2 and to the input of a tracking analog to digital (A/D) converter A1. When the A/D converter A1 receives a gated burst clock signal TA from a timing generator A3, the A/D converter A1 rapidly generates an output signal S2 that follows the input signal S1. The output signal S2 of the A/D converter A1 is applied to the negative input of the differential amplifier U2 which subtracts the two signals S1 and S2 and produces a signal S4 nearly equal to zero at the output of differential amplifier U2, the output signal S4 of the differential amplifier U2 is not quite zero. To achieve a zero magnitude signal, the output signal S4 of the differential amplifier U2 is simultaneously applied to the positive input of a second differential amplifier U3 and to a sample and hold circuit U4, the output signal S5 of which is applied to the negative input of differential amplifier U3.

After the tracking A/D converter A1 has acquired the input signal S1 within a predetermined time, the timing generator A3 effectively switches the A/D converter A1 to a hold mode and then switches the sample and hold circuit U4 into a sample mode. When the sample and hold circuit U4 is in the sample mode it produces an output signal S5 which has a value equal to signal S4. Signal S5 is applied to the negative input of the second differential amplifier U3. The output of the differential amplifier U3 is a zero magnitude signal S6. With zeroing or cancellation of the input signal accomplished, the timing generator A3 effectively switches the sample and hold circuit U4 into a hold mode and the system 10 is then ready to detect any changes in the slope of the input signal S1.

The output signal S6 of the differential amplifier U3 is applied to the positive input of a comparator U5 which compares signal S6 to a reference voltage VR which is applied to the negative input of the comparator U5. The comparator U5 is an operational amplifier which is arranged to produce an output signal S7 which changes from a positive value to a negative value whenever its input signal S6 becomes more negative than the reference voltage VR. If the input signal S1 produces a slope that equals or exceeds a predetermined value in the negative direction, signal S6 will drop below the reference voltage VR causing the output signal S7 of the comparator U5 to go negative. The negative signal S7 is thereafter clamped at the zero level by diode D1 and then clocked into a count logic circuit A2 at the next clock signal TC applied to the count logic circuit A2. If the signal S6 equals or exceeds the reference voltage VR during three successive window times TW of predetermined duration, the count logic circuit A2 will produce a high level output signal S8. If the desired slope is not detected during three successive window times TW, the output signal S7 of the comparator U5 will revert to a positive value which event causes the count logic circuit A2 to automatically reset to zero.

The detection level of the slope detector 10 is principally determined by the overall gain, G, of the system up to the input of the comparator U5, the value of the reference voltage VR, and the duration of the window time TW.

In the particular implementation shown herein the overall gain, G, is set at 250, the reference voltage VR is set at −100 mv, and the window time TW is set at 400 ms. Hence the slope detector 10 of this invention will correctly indicate an input signal having a slope equal to or greater than −1 mv per second for at least 1.5 seconds. (The period of 1.5 seconds includes three zeroing times TZ, the meaning of which is explained below.)

The detection level may be varied by varying the gain G, the reference voltage VR and the window time TW. In all cases the minimum detected slope S is determined as follows:

$$S = (VR)/(G \times TW).$$

Figure 2:
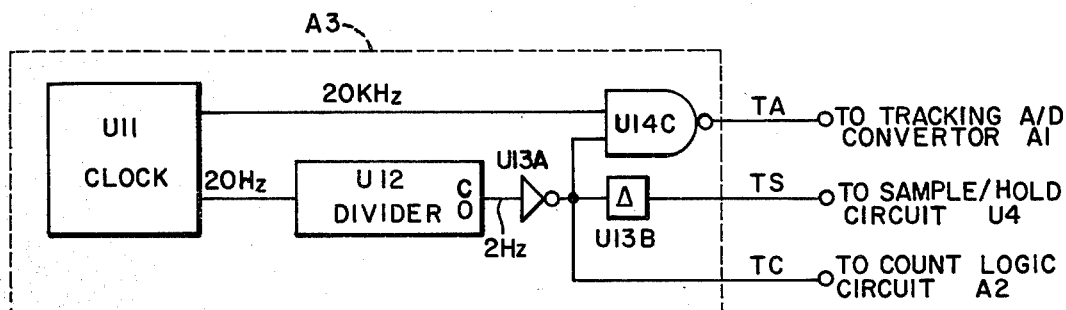
FIG. 2 is a block diagram of a timing generator which forms a part of the slope detector shown in FIG. 1.

All timing signals for the slope detector 10 are produced by a timing generator A3. A block diagram of the timing generator A3 is shown in FIG. 2. The 20 KHz and 20 Hz outputs from a standard clock U11 are employed. The 20 Hz output is applied to a conventional divider U12 where it is effectively divided by ten to produce a 2 Hz output at the carry-out (CO) terminal of the divider U12. The 2 Hz output is applied to an inverter U13A and thereafter applied to a NAND gate U14C as well as to a delay unit U13B. The output of the inverter U13A and the delay unit U13B is a series of pulses having a duration of 50 ms and a repetition rate of two pulses per second. The output TS of the delay unit U13B is delayed 50 ms with respect to the output TC of the inverter U13A and is fed to the sample and hold circuit U4. The output TC of the inverter U13A is fed to the count logic circuit A2. The output TA of the NAND gate U14C is a gated burst of 20 KHz pulses having a duration of 50 ms; the output TA is fed to the A/D converter A1.

Figure 3:
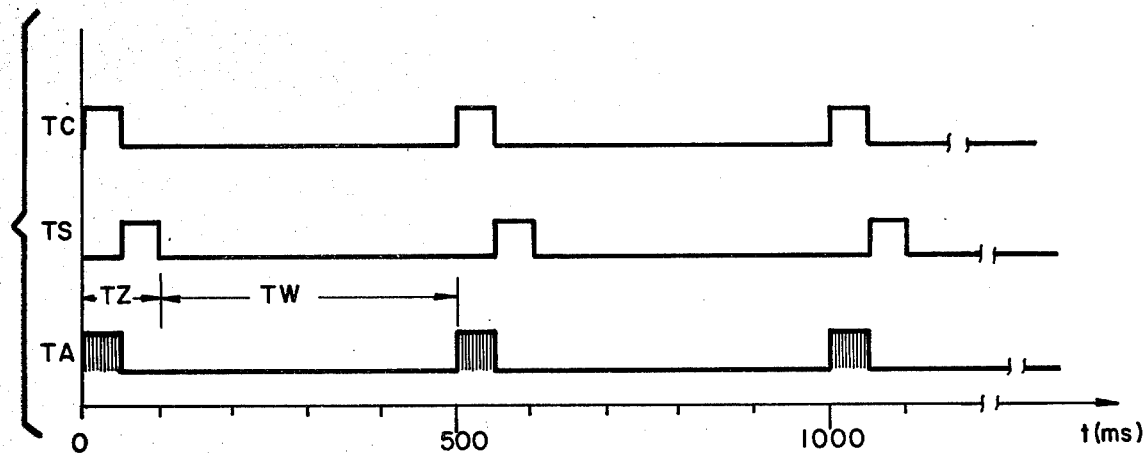
FIG. 3 is a timing diagram illustrating the clock signals produced by the timing generator and their temporal relationship.

A timing diagram which illustrates the three outputs TA, TS, TC of the timing generator A3 and their temporal relationship to each other is shown in FIG. 3. In the particular implementation shown herein, the gated burst track command signal TA and the sample and hold enable signal TS follow each other and each is 50 ms in duration. Together these two clock signals, TS and TA, form a zeroing time TZ of 100 ms duration. During the first 50 ms portion of the zeroing time TZ the A/D converter A1 matches the input signal to within plus or minus one bit. During the latter 50 ms portion of the zeroing time TZ the sample and hold circuit U4 cancels the input signal S1. After the zeroing time TZ is completed, that is, after the clock outputs TC and TS are both low, a window time TW of 400 ms duration immediately follows. During the window time TW, the outputs of the A/D converter A1 and the sample and hold circuit U4 are each held at their last respective acquired values. Hence, during the window time TW the system 10 is able to effectively track the slope of the input signal S1.

Figure 4A:
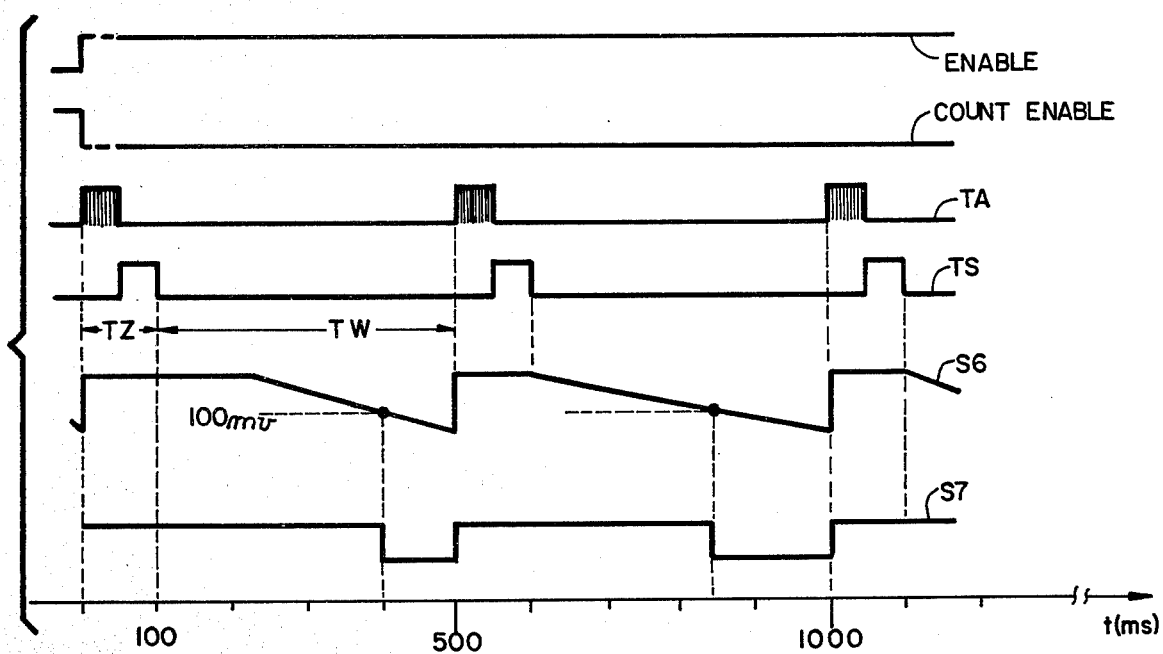
FIG. 4a is a combined timing and waveform diagram which illustrates the temporal relationships between the clock signals and certain signals which are generated within the slope detector.
Figure 4B:
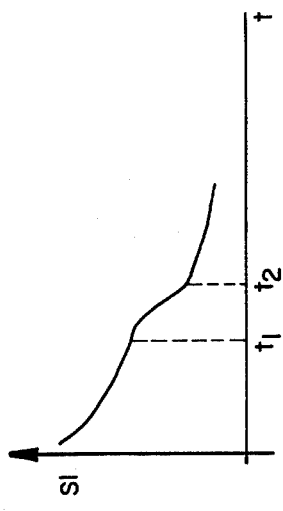
FIG. 4b is a waveform diagram of a typical input signal.

FIG. 4a is a combined timing and waveform diagram which illustrates the temporal relationships between the clock signals TA and TS and certain critical signals which are produced within the slope detector 10. FIG. 4b illustrates a typical input signal S1 waveform. In the context of the foregoing discussion, the slope detector 10 would produce a low output, signal S8, before time t1 and after time t2 since the slope of the input signal does not equal or exceed −1 mv/sec as it does between times t1 and t2.

Figure 5:
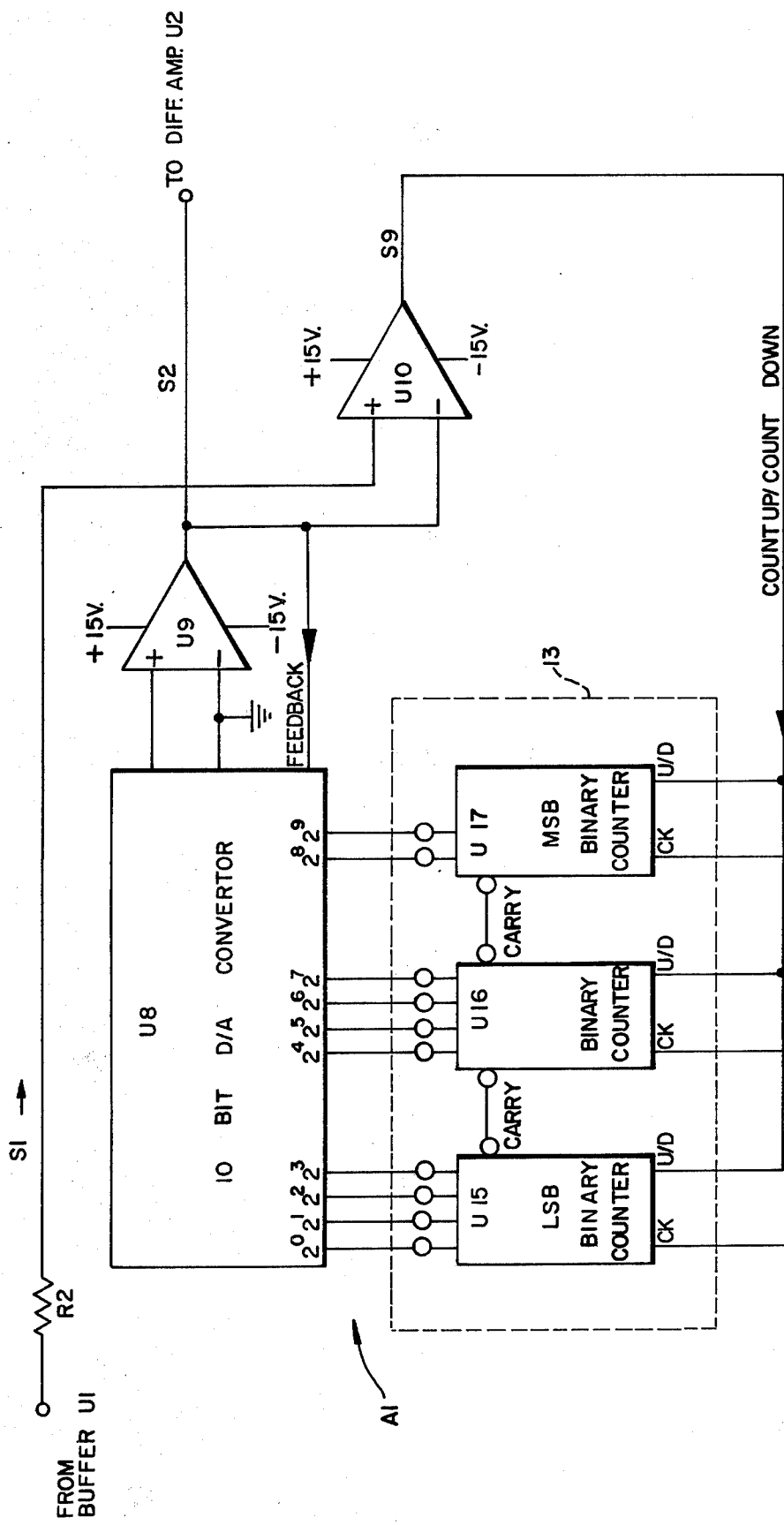
FIG. 5 is a block diagram of a tracking analog to digital converter which forms a part of the slope detector shown in FIG. 1.

The tracking A/D converter A1, is shown in more detail in FIG. 5. The analog input signal S1 which is to be closely approximated by the A/D converter A1 is applied to the positive input of a comparator U10. The timing generator A3 produces the gated burst clock signal TA which is applied to the clock input of a ten bit binary up/down counter 13 comprised of three conventional stages U15, U16, and U17. The counter 13 generates a ten-bit word the value of which depends upon the number 20 KHz clock pulses it is permitted to count during the 50 ms duration of signal TA. The 10-bit word is applied to the input of a ten-bit digital to analog (D/A) converter U8 which may be any suitable one of many well known devices now available. The D/A converter U8, in combination with its output operational amplifier U9, generates an analog signal S2 at the output of the amplifier U9. The value of this signal S2 corresponds to the value of the digital count word produced by the counter 13. The analog output signal S2 is also applied to the negative input of a comparator U10. Once the gated burst clock signal TA has been applied to the counter 13, it will produce a digital word that increases in value in 20 KHz clock increments and the D/A converter U8 produces an analog signal S2 that increases in value until its magnitude is equal to that of the input signal S1. On the next 20 KHz clock count the analog signal S2 forces the comparator U10 to switch the polarity of its output signal S9 from a positive value to a negative value. A negative signal S9 reverses the counter 13 and causes it to count down until the analog signal S2 is once again less than the input signal S1. From this time the value of the analog signal S2 will vary between plus or minus one bit of the input signal S1. If the input signal S1 should vary, the analog signal S2 will follow it to within ±1 bit until the termination of the gated burst clock signal TA. At that time the analog signal S2 will remain at its last value until the next gated burst clock signal TA is applied to the counter 13. Since the analog signal S2 is always within ±1 bit of the input signal S1 when signal TA terminates, the analog signal S2 should be within one part in one thousand of the last value of the input signal S1. This will be the case as long as the input signal S1 changes at a rate that is slow compared to the update (clock) rate of the tracking A/D converter A1.

Figure 6:
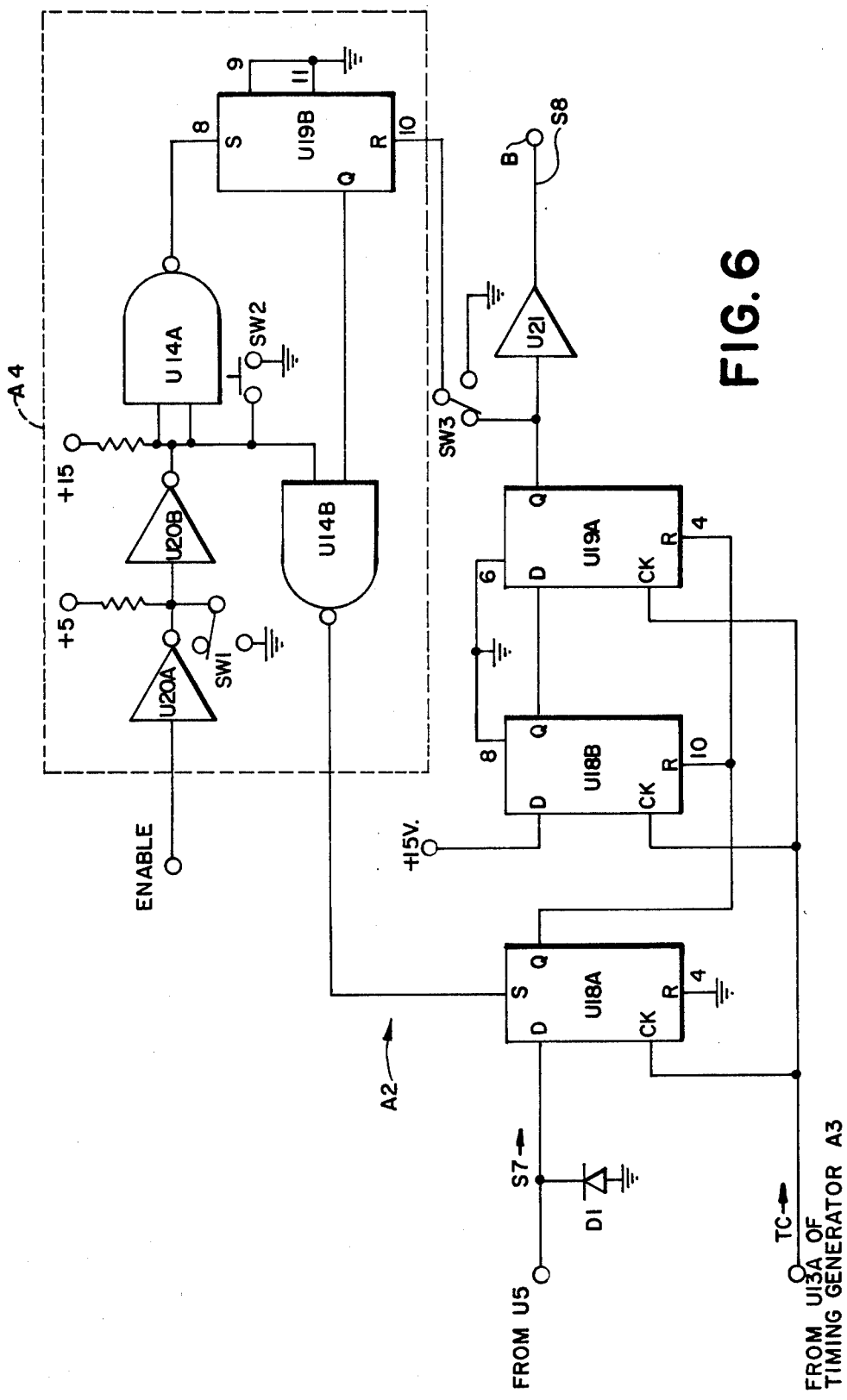
FIG. 6 is a block diagram of a count logic circuit and an enable gating circuit both of which form a part of the slope detector shown in FIG. 1.

The count logic circuit A2 and enable gating circuit A4 are shown in more detail in FIG. 6. A positive enable signal is applied to the input of inverter chain U20A and U20B which in turn supplies a positive signal to an input of NAND gate U14B as well as to both inputs of NAND gate U14A. The low output of gate U14A releases the set signal on D-Type flip-flop U19B which is initially in the set position with a positive signal on its Q output. Flip flop U19B remains in the set state when its set input goes low, however, it is no longer held there but is conditioned for a change of state. The Q output of flip flop U19B is applied to the other input of gate U14B which now has, since the onset of the enable signal, two positive inputs and it thereby produces a low output which is applied to the set input of D-Type flip-flop U18A. A low on the set input of flip flop U18A releases the set signal which had been holding flip flop U18A in the set state. The Q output of flip flop U18A is applied to each reset line of both D-Type flip-flops U18B and U19A which are each held in the zero output state when the Q output of flip flop U18A is high. Once flip flop U18A is no longer held in the set state, the count logic circuit A2 is enabled.

The input signal S7 to the count logic circuit A2 comes from the comparator U5. (See FIG. 1). When the condition is met that a negative ramp on the positive input of comparator U5 is more negative with respect to the reference voltage, VR, on the negative input of comparator U5, the output signal S7 of the comparator U5 will switch from a positive to a negative value. However, diode D1 clamps signal S7 at the zero level. This clamped signal S7 is applied to the D input of flip flop U18A which, when clocked on the next clock input TC, will transfer the zero at its D input to its Q output. This low or zero Q output of flip flop U18A is applied to the resets of both flip flops U18B and U19A which are then no longer held in the zero state. The next clock pulse TC into flip flop U18B will transfer the fixed 15 volt high or one on its D input to its Q output. At the same clock time, the zero that was present at the Q output of flip flop U18B and the D input of flip flop U19A is transferred to the Q output of U19A thus maintaining a low or zero at the Q output of flip flop U19A. The third clock pulse TC to clock flip flops U18A, U18B and U19A will transfer the one on the D input of U19A to its Q output which, being connected to the input of buffer U21 will produce a positive level signal S8 at the output of U21. Thus if a zero level signal S7 on the D input of U18A is present for three consecutive clock pulses TC the output of U21 will go positive producing a high output signal S8 at terminal B. If the D input of flip flop U18A should go positive after one or consecutive clock pulses TC, the Q output of U18A will go positive and reset flip flops U18B and U19A before a positive output at buffer U21 is achieved.

In this version of the count logic circuit A2 it should be noted that, as soon as the Q output of flip flop U19A goes high, flip flop U19B is reset to the zero state. With flip flop U19B in the zero state, the output of NAND gate U19B goes high which in turn sets flip flop U18A to the one state. This in turn resets both flips U18B and U19A to the zero state causing the output signal S8 to go low as well as releasing flip flop U19B from the reset state although it still produces a low Q output.

Hence on the third clock pulse TC, the output signal S8 will not be a sustained high level signal but a high level signal of short duration. In other words, this version of the count logic circuit A2 does not have memory.

As long as flip flop U19B produces a low Q output, NAND gate U14B will supply a high level signal to flip flop U18A to keep it in the one state regardless of subsequent clock signals TC or input signals S7 supplied to flip flop U18A. The count logic circuit can be initialized by lowering the high level enable signal which places flip flop U19B into the one state. In the absence of a positive enable signal, the inverter chain 20A, 20B and NAND gate 14A puts flip flop U19B in the set state.

Figure 7:
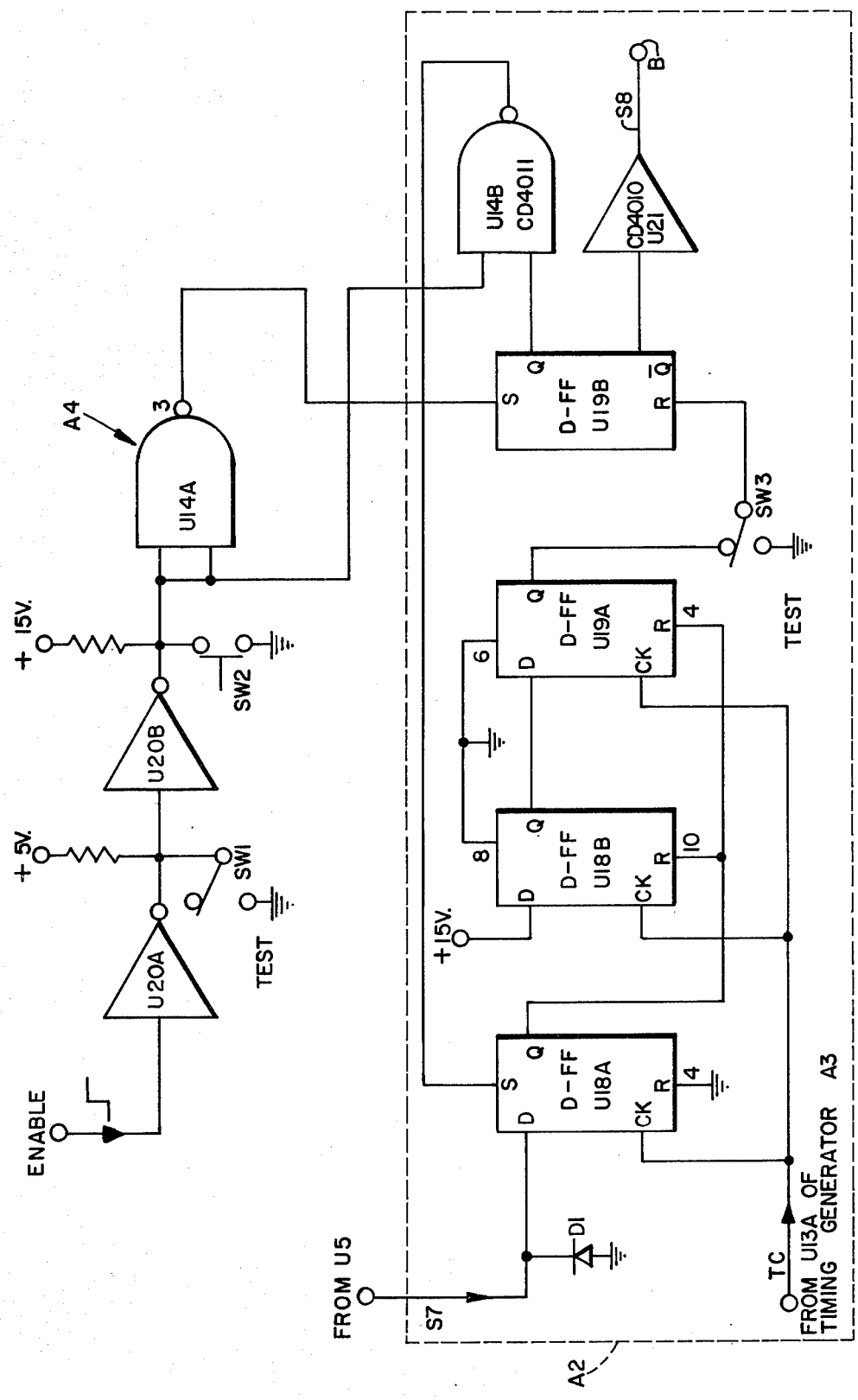
FIG. 7 is a block diagram of an alternate embodiment of the count logic circuit.

An alternate embodiment of the count logic circuit A2 is shown in more detail in FIG. 7. An enable signal (a positive step function) is applied to the input of inverter chain U20A and U20B which in turn supply a positive signal to a third inverter connected gate U14A. The low output of inverter U14A is applied to the set input of flip flop U19B which is then no longer held in the set condition allowing flip flop U19B to be reset if it receives a reset signal. The Q output of U19B remains high and provides a high to one input of NAND gate U14B. The positive signal at the input of U14A is also applied to the other input of gate U14B forcing the output of U14B to go low and releasing the set condition from D-type flip flop U18A. The count logic circuit A2 is now armed and enabled to properly sense the input signal S7.

As before, the input signal S7 applied to the count logic circuit A2 is provided from the output of the comparator U5. (See FIG. 1). The clamped input signal S7 is applied to the D input of flip flop U18A which, on the next clock pulse TC, will transfer the zero on its D input to its Q output releasing the reset signal of both flip flops U18B and U19A. Since these two flip flops are no longer held in the reset or zero state the next clock pulse TC will cause the fixed 15 volt high or one on the D input of U18B to be transferred to its Q output as well as to the D input of flip flop U19A. A third clock pulse TC will cause the high on the D input of U19A to be transferred to its Q output. A high Q output from flip flop U19A resets flip flop U19B to the zero state. In the zero state flip flop U19A produces a high at its $\overline{Q}$ output which is applied to buffer U21 which in turn produces the desired high output signal S8. At the same time, the Q output of U19B goes low which causes the output of U14B to go high setting the output of flip flop U18A to a high and thereby reseting flip flops U18B and U19A to the zero state. The count logic circuit A2 will remain in this state, i.e. it has memory and the output signal S8 will remain high until the enable signal on the input of U20A is returned to a low state. When the enable signal goes low a low is produced on the input of U14A forcing its output to go high to thereby preset flip flop U19B to the one state to thereby return the output signal to a low level.

If signal S7 should return to a positive level before the third consecutive clock pulse TC has occurred, the Q output of U18A will go high and both flip flops U18B and U19A will be reset to the zero state. Under these conditions, output signal S8 will remain low and the count of three must be restarted. Hence, a high level output signal S8 will only be produced if the input signal S7 is low for three consecutive clock pulses TC.

In both versions of the count logic circuit A2 the three switches SW1, SW2 and SW3 are used for testing purposes.

Figure 8A:
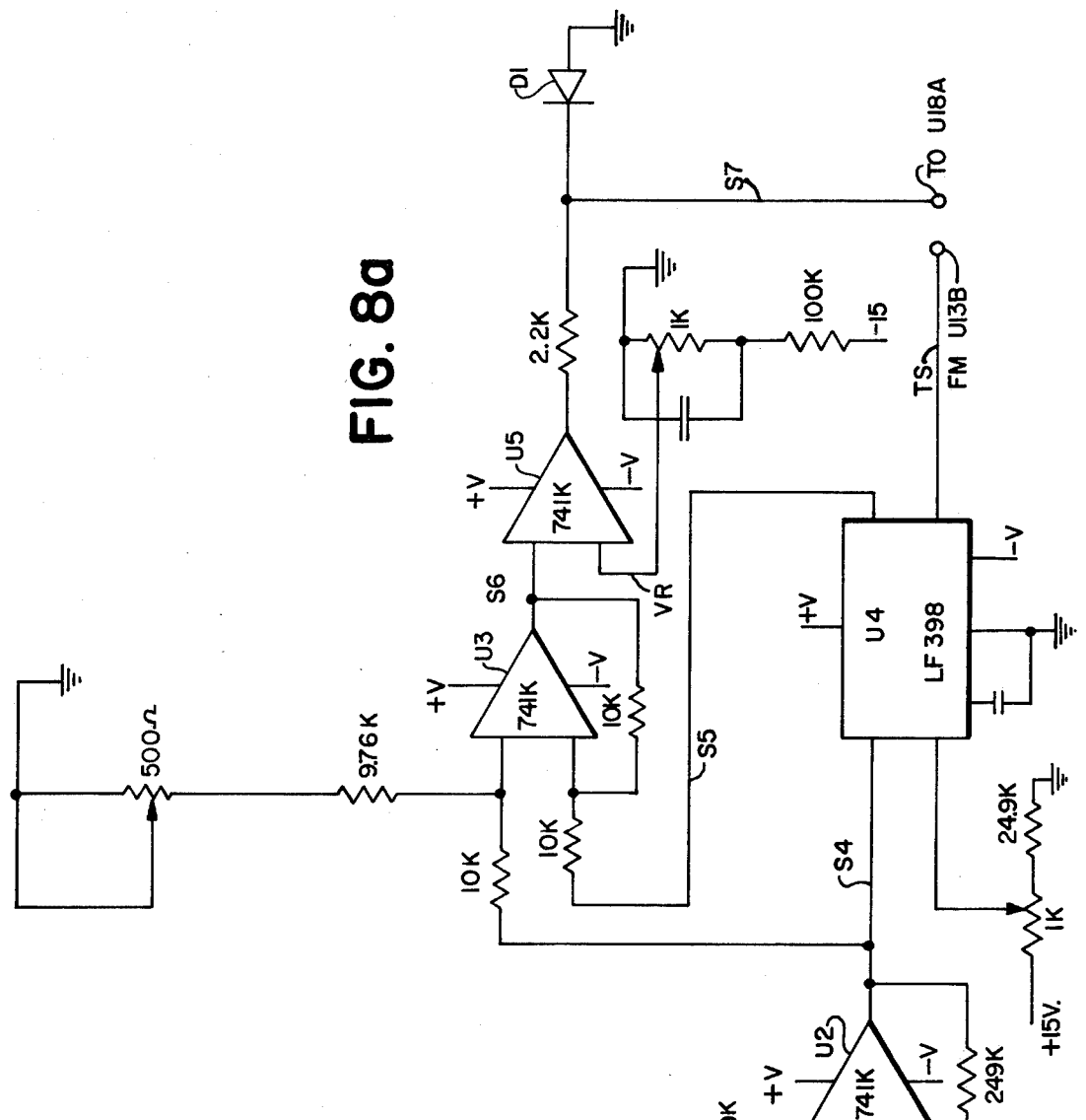
FIGS. 8a, 8b, and 8c form a schematic diagram of the slope detector constructed according to the invention and which is shown in block diagram form in FIG. 1.
Figure 8B:
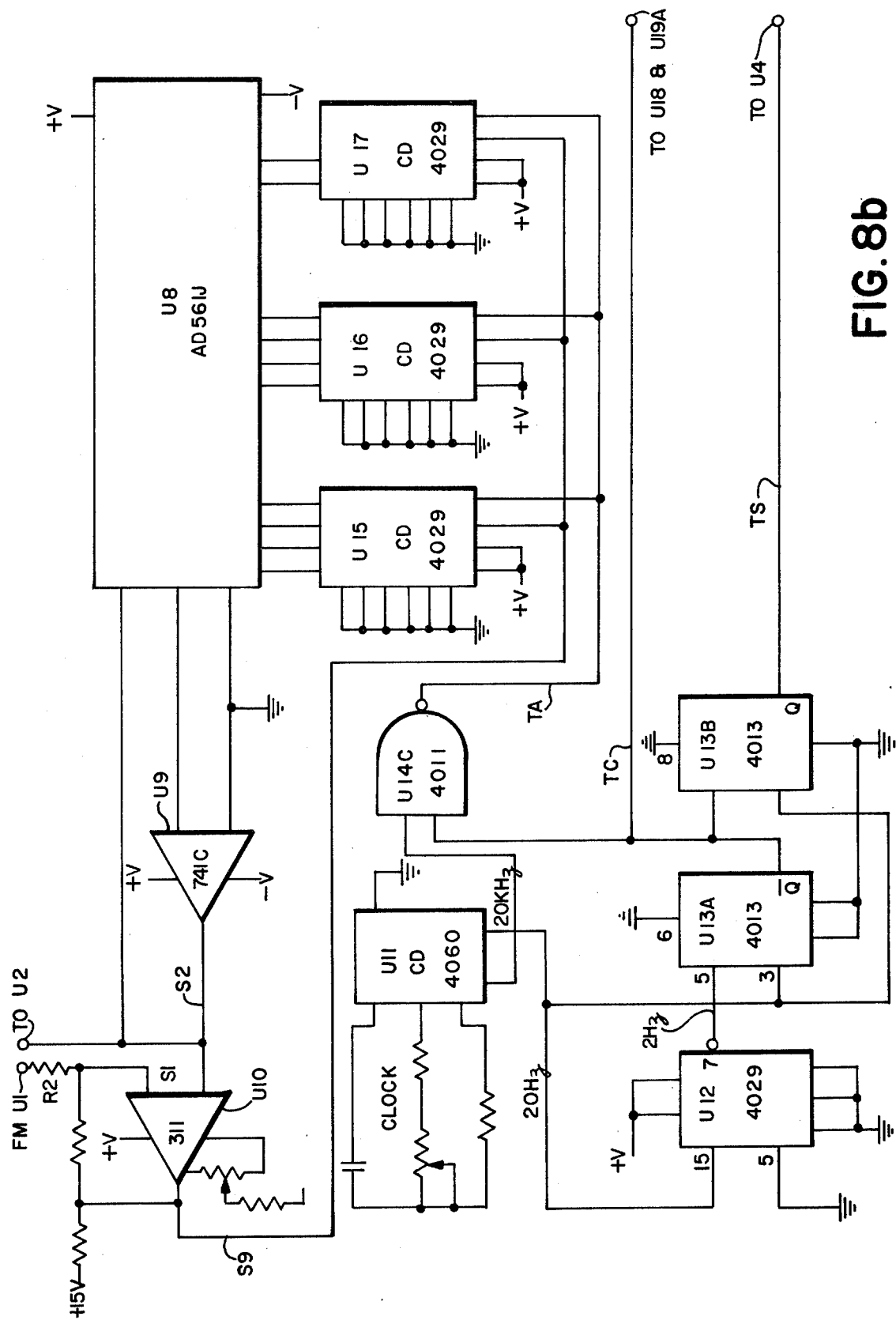
Figure 8C:
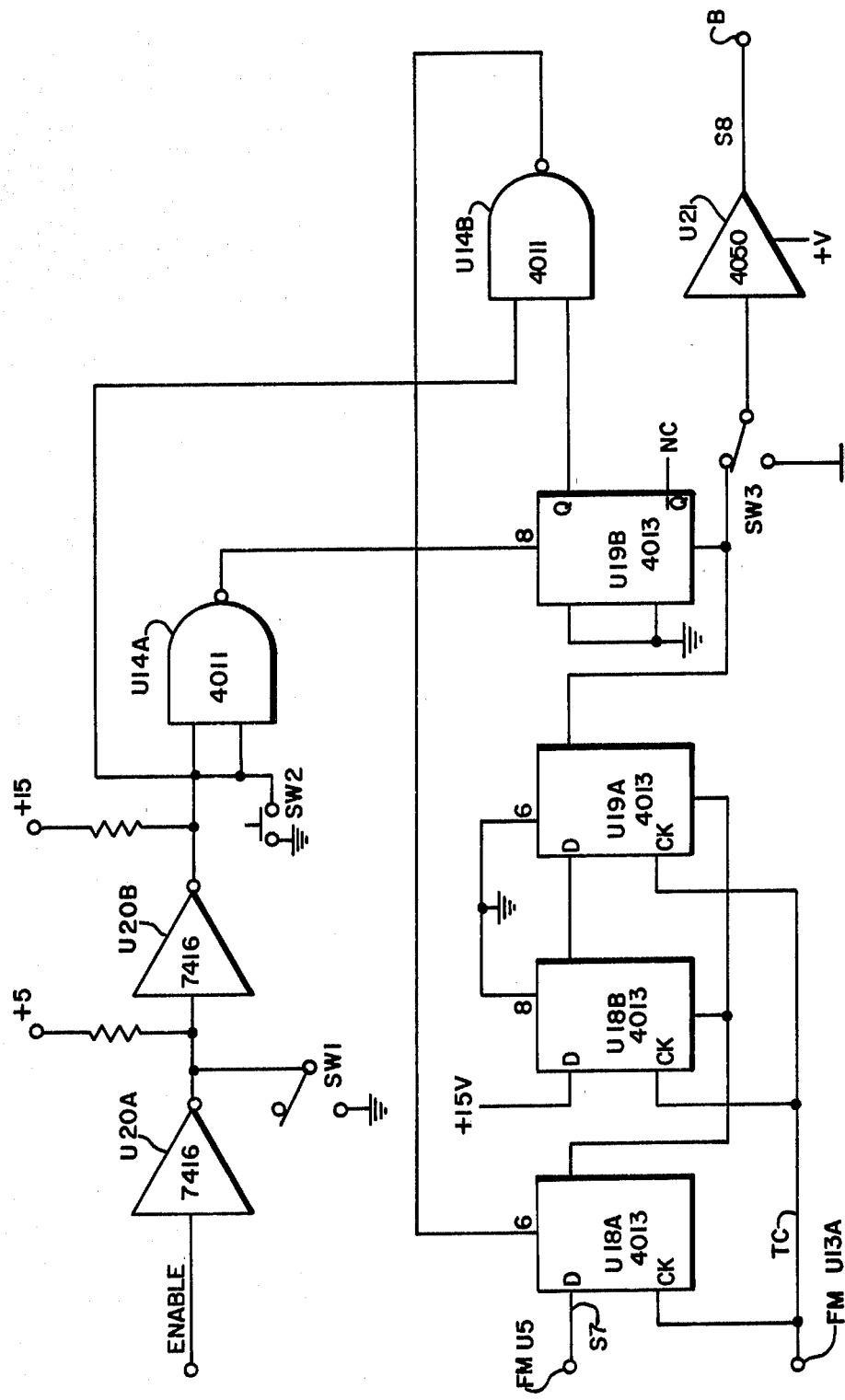

FIGS. 8a, 8b and 8c form a schematic diagram of the slope detector 10. The diagram is self explanatory. All of the circuit elements employed in the slope detector 10 are of conventional construction.

I claim:

1. Apparatus, to determine if the slope of an input signal equals or exceeds a predetermined value in a predetermined time, comprising:
    first means, responsive to said input signal, for generating a first signal which is substantially equal to the input signal;
    second means, responsive to the first signal and the input signal for producing a second signal which is equal to the difference between the input signal and the first signal;
    third means, responsive to the second signal, for generating a third signal which matches the second signal;
    fourth means, responsive to the second signal and the third signal, for producing a fourth signal which is equal to the difference between the second signal and the third signal;
    fifth means, responsive to the fourth signal, for producing a fifth signal whenever the fourth signal equals or exceeds a predetermined value; and
    sixth means, responsive to the fifth signal, for producing an output signal whenever the fifth signal is present for a predetermined time.

2. Apparatus, to determine if the slope of an input signal equals or exceeds a predetermined value in a predetermined time, comprising:
    an analog to digital converter, responsive to the input signal, which produces an output nearly equal to the input signal, during a first time period;
    a first differential amplifier which produces a coarsely zeroed signal equal to the difference between the input signal and the output of the analog to digital converter;
    a sample and hold circuit for producing an output which matches the output of the first differential amplifier, during a second time period;
    a second differential amplifier for producing a finely zeroed output equal to the difference between the output of the first differential amplifier and the output of the sample and hold circuit;
    a comparator, responsive to the output of the second differential amplifier and a reference voltage, for producing an output whenever the output of the second differential amplifier equals or exceeds the reference voltage; and
    a counter for recording the presence of the comparator output during a third time period and for producing an output signal whenever the comparator output is present during three consecutive third time periods.

3. Apparatus according to claim 2 further including a timing generator for controlling said analog to digital converter, said sample and hold circuit and said counter.

* * * * *